(12) United States Patent
McCall (10) Patent No.: US 10,774,981 B1
(45) Date of Patent: Sep. 15, 2020

(54) COLLAPSIBLE SUPPORT STRUCTURE FOR A REMOVABLE ELECTRONIC DEVICE

(71) Applicant: Todd McCall, Tampa, FL (US)

(72) Inventor: Todd McCall, Tampa, FL (US)

( * ) Notice: Subject to any disclaimer, the term of this patent is extended or adjusted under 35 U.S.C. 154(b) by 0 days.

(21) Appl. No.: 16/705,366

(22) Filed: Dec. 6, 2019

(51) Int. Cl.

| | |
|---|---|
| *F16M 11/38* | (2006.01) |
| *F16M 11/04* | (2006.01) |
| *F16M 11/42* | (2006.01) |
| *E05B 73/00* | (2006.01) |
| *F16M 13/04* | (2006.01) |
| *H05K 5/02* | (2006.01) |
| *G06F 3/041* | (2006.01) |
| *H05K 5/00* | (2006.01) |
| *G06F 3/0488* | (2013.01) |

(52) U.S. Cl.
CPC ......... *F16M 11/38* (2013.01); *E05B 73/0082* (2013.01); *F16M 11/041* (2013.01); *F16M 11/42* (2013.01); *F16M 13/04* (2013.01); *G06F 3/041* (2013.01); *H05K 5/0017* (2013.01); *H05K 5/023* (2013.01); *H05K 5/0221* (2013.01); *H05K 5/0226* (2013.01); *H05K 5/0234* (2013.01); *G06F 3/0488* (2013.01)

(58) Field of Classification Search
CPC ...... F16M 11/38; F16M 13/04; F16M 11/041; F16M 11/42; H05K 5/0234; H05K 5/0226; H05K 5/0221; H05K 5/0017; H05K 5/023; G06F 3/041; G06F 3/0488; E05B 73/0082
USPC ...................................................... 248/188.5
See application file for complete search history.

(56) References Cited

U.S. PATENT DOCUMENTS

| | | | | |
|---|---|---|---|---|
| 5,970,980 A | * | 10/1999 | Adair ....................... | H04N 5/64 128/849 |
| 6,339,410 B1 | * | 1/2002 | Milner .................... | G09B 21/00 345/1.1 |
| 6,825,415 B1 | * | 11/2004 | Chen ....................... | F16M 11/10 174/50 |
| 6,961,234 B2 | * | 11/2005 | Tanaka .................... | F16M 11/10 248/460 |
| 2001/0045497 A1 | * | 11/2001 | Coonan .................. | A47B 21/00 248/123.11 |
| 2005/0156952 A1 | * | 7/2005 | Orner ....................... | F16M 11/18 345/173 |
| 2016/0270525 A1 | * | 9/2016 | Aldrich ................. | H01F 7/0205 |
| 2017/0318958 A1 | * | 11/2017 | Asante .................... | F16M 11/28 |

\* cited by examiner

*Primary Examiner* — Muhammad Ijaz
(74) *Attorney, Agent, or Firm* — Tiffany C. Miller; Inventions International Inc.

(57) ABSTRACT

A collapsible support structure for a removable electronic device. The electronic device having a touch screen configured for a user to access at least one predetermined construction document and/or application is removably connected to the support structure. The electronic device may be retained in a housing configured to be water resistant and/or impact resistant. The support structure may have a locking mechanism configured for an authorized user to gain access to remove the electronic device from the support structure, thereby, preventing an unauthorized user from gaining access for removal of the electronic device from the support structure. The support structure is configured to be foldable in a closed orientation during storage. The support stand may have a plurality of casters connected thereto.

4 Claims, 8 Drawing Sheets

COLLAPSIBLE SUPPORT STRUCTURE FOR A REMOVABLE ELECTRONIC DEVICE

BACKGROUND OF THE INVENTION

1. Field of the Invention

This invention relates, generally, to a collapsible support structure for a removable electronic device. More particularly, it relates to a support structure for an electronic device having a touch screen that is capable of receiving and locking an electronic device in position and being oriented in an upright orientation during use, as well as folding into a closed orientation during storage.

2. Background Art

Traditional methods of conducting construction productivity is organized by providing a user including, but not limited to, an engineer, a construction worker, a project team member, a code enforcement agent, an end user, or a building inspector, with information including, but not limited to, any construction document such as, a blueprint, instructions, or permit information. These construction documents are typically printed out and a courier delivers the construction documents to a job site. The status relating to any changes, amendments, additions, deletions, or updates to the construction documents are notated and delivered by courier to the receiving party, which can be time consuming and may delay project progress. Construction documents can be digitized Thus, there is a need for real-time, instant notification of the status of a plurality of construction documents associated with a construction related project, access to a plurality of construction documents associated with a construction related project, and ability to modify the plurality of construction documents for all users involved in the construction productivity of a construction project.

Currently, construction documents are accessed through the use of a user's personal electronic device such as a tablet having a touch screen or a smart phone having a touch screen. It may be difficult for a group or users to access and update or submit documents through the small size of a graphic user interface of a personal electronic device. Thus, there is a need for a construction kiosk having a graphic user interface of a touch screen capable of being viewed and accessible to a group of users at a construction site. Further, it would be more desirable for the electronic device having a touch screen to be removably connected to the kiosk stand so that the electronic device may be placed on a table during use as well. In addition, a kiosk stand having a locking mechanism configured to maintain a fixed connection between the kiosk stand and the electronic device would prevent tampering or theft of the electronic device from the construction site.

Some construction documents are accessed through a computer placed inside of a rolling steel toolbox at a construction site. The problem with this existing construction productivity method is the bulkiness of the toolbox, which inhibits the ease of transporting the electronic documents from each construction site. It would be more desirable for the supporting stand of the electronic device to be foldable to a closed orientation that is compact for easy transport. Further, the computer of current methods located on the toolbox often gets damaged when exposed to the elements such as rain, snow, sunlight, or construction debris. This there is a need for the electronic device to have a protective barrier. Finally, a computer placed on a toolbox is susceptible to theft because of the lack of securing means to secure the computer onto the toolbox. Thus, there is a need for a novel locking mechanism capable of preventing unauthorized removal of the electronic device from its supporting structure.

However, in view of the prior art considered as a whole at the time the present invention was made, it was not obvious to those of ordinary skill in the pertinent art how the identified needs could be fulfilled.

SUMMARY OF THE INVENTION

The long-standing but heretofore unfulfilled need for a novel collapsible support structure for a removable electronic device. The electronic device having a touch screen configured for a user to access at least one predetermined construction document and/or application is removably connected to the support structure. The electronic device may be retained in a housing configured to be water resistant and/or impact resistant. The support structure may have a locking mechanism configured for an authorized user to gain access to remove the electronic device from the support structure, thereby, preventing an unauthorized user from gaining access for removal of the electronic device from the support structure. The support structure is configured to be foldable or collapsible in a closed orientation during storage. The support stand may have a plurality of casters connected thereto. This novel invention also includes improvements that overcome the limitations of prior art collapsible support structures for an electronic device and is now met by a new, useful, and non-obvious invention.

The novel collapsible support structure for a removable electronic device has an electronic device having a touch screen. It is within the scope of this current invention for the electronic to have a touch screen or to not have a touch screen such as a traditional computer. The electronic device is in electrical communication with a power source. It is within the scope of this invention for the electronic device to be connected to a power source including, but not limited to, a battery or a remote power source such as the computer having an electric cord plugged into an outlet. The support structure has a first end located opposite a second end. It is within the scope of this invention for the electronic device to have a bracket and to be removably connected to the support stand and then positioned on a table, a tool box, a tool box lid, or on a portion of a vehicle or a tool box truck.

The electronic device is removably connected to the first end of the support structure. It is within the scope of this invention for at least a portion of the electronic device to have a bracket connected thereto. The bracket may be removably connected to a corresponding capturing structure connected to the first end of the support structure. A locking mechanism may lock the bracket of the electronic device within the capturing structure of the support structure, thereby, preventing unauthorized removal of the electronic device from the support structure. It is within the scope of this invention for the locking mechanism to be any locking mechanism including, but not limited to, mechanical, digital, fingerprint, combination, or lock and key.

The support structure has a base having a first side located opposite a second side. The first side of the base is connected to the second end of the support structure. It is within the scope of this invention for the base to be configured to anchor the support structure in an upright orientation and to prevent the support structure from tilting over when the electronic device is being used. The base may have an opening. The opening of the base can have finger grips configured to receive the hand of a user. The opening of the base may be grasped by a user when the support structure is hingedly pivoted in a closed position. The opening of the base may be grasped by a user during transportation of the device, a user may carry the collapsible support structure with the aid of the opening of the base.

The support structure can have a locking mechanism having a first portion and a second portion. The electronic device has a first portion of the locking mechanism. The first end of the support structure has a second portion of the locking mechanism. The first portion of the locking mechanism and the second portion of the locking mechanism are configured to connect to form a locked orientation, whereby, the locked orientation is configured to prevent an unauthorized user from removing the electronic device from the support structure.

In an alternate embodiment, the second end of the base is connected to a plurality of casters or rollers. The device may be rolled by a user from a first location to a second location without having to pick the unit up from the ground. It is within the scope of this invention for the base to have a weight ballast, at least one handle, attachment means for support structure pieces, a mounting surface configured to receive at least a portion of the support structure, or rollers.

In a preferred embodiment, the electronic device has at least one predetermined application or construction document. The application is configured to be accessible to a user through a graphic user interface of the touch screen of the electronic device. It is envisioned that the at least one predetermined application is installed onto the electronic device by an administrator or programmer. For example, a manager overseeing a construction project may only want the employees to have access to a permit portal and sketches. The manager may want to prohibit the employees from making unauthorized searches from an internet browser on the novel collapsible support structure for a removable electronic device. Thus, the manager has identifying credentials which permit access to program the at least one predetermined application or construction document.

In another alternate embodiment, the electronic device is retained in a housing. The housing has a transparent portion oriented to overlay said touch screen of the electronic device. The housing may be impact resistant. The housing may be water resistant. The transparent portion of the housing is configured to allow a user to operate the touch screen while installed on the electronic device.

The support structure is hingedly pivotable to a foldable orientation. The support structure is configured to be oriented in a folded position when the support structure is hingedly pivoted in a closed configuration. The support structure is configured to be oriented in an upright position when the support structure is hingedly pivoted in an open configuration.

In another embodiment, the support structure is slidably traversable or configured to be telescoped to extend an open length. The support stand can have a plurality of pieces that can be removably assembled onto an end of each other to form an upright, open orientation. The plurality of support stand pieces may be disassembled by a user and stored by being connected to the base when not in use. It is within the scope of this invention for the support stand to include, but not be limited to, a collapsible post.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Figure 1:
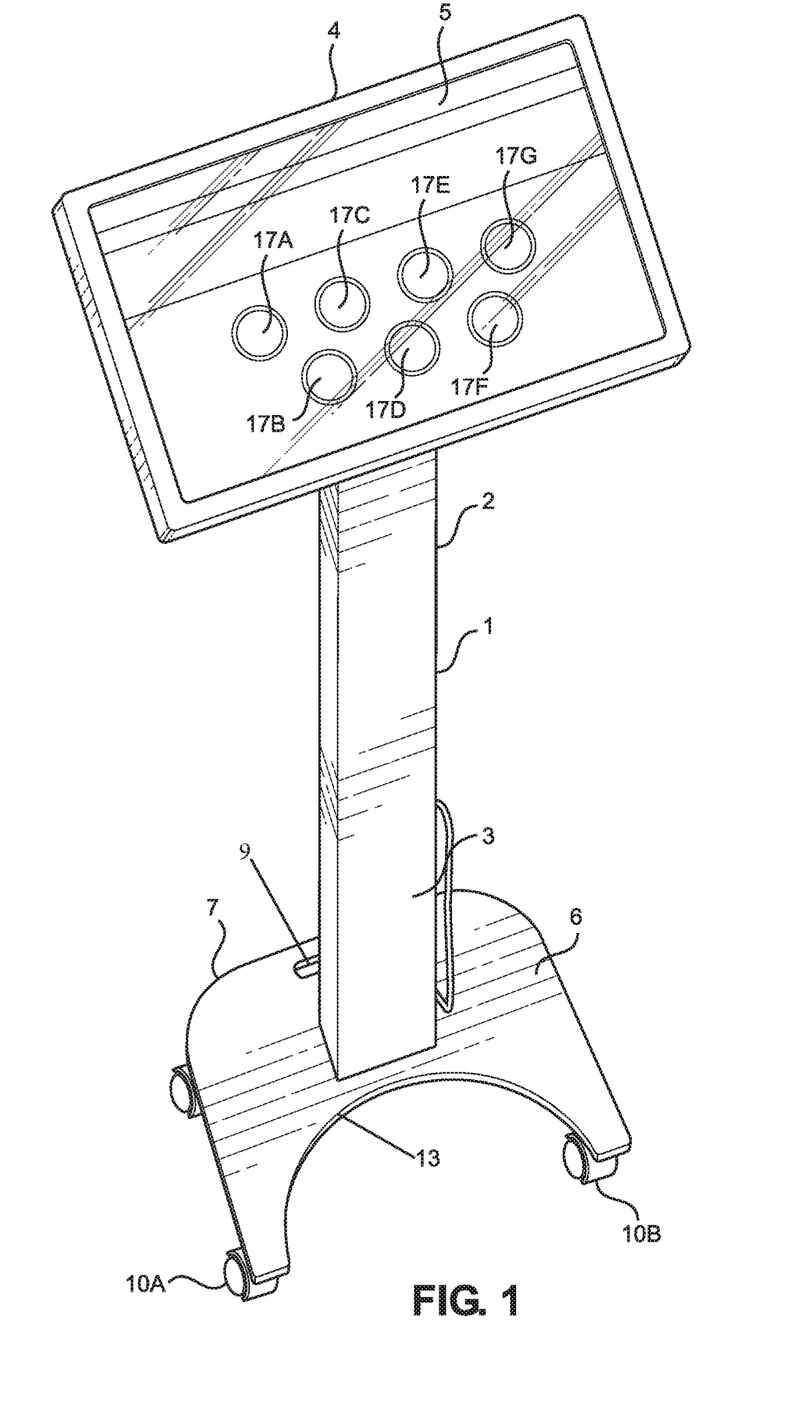
FIG. 1 is a front perspective view of the support structure for an electronic device having a touch screen.
Figure 2:
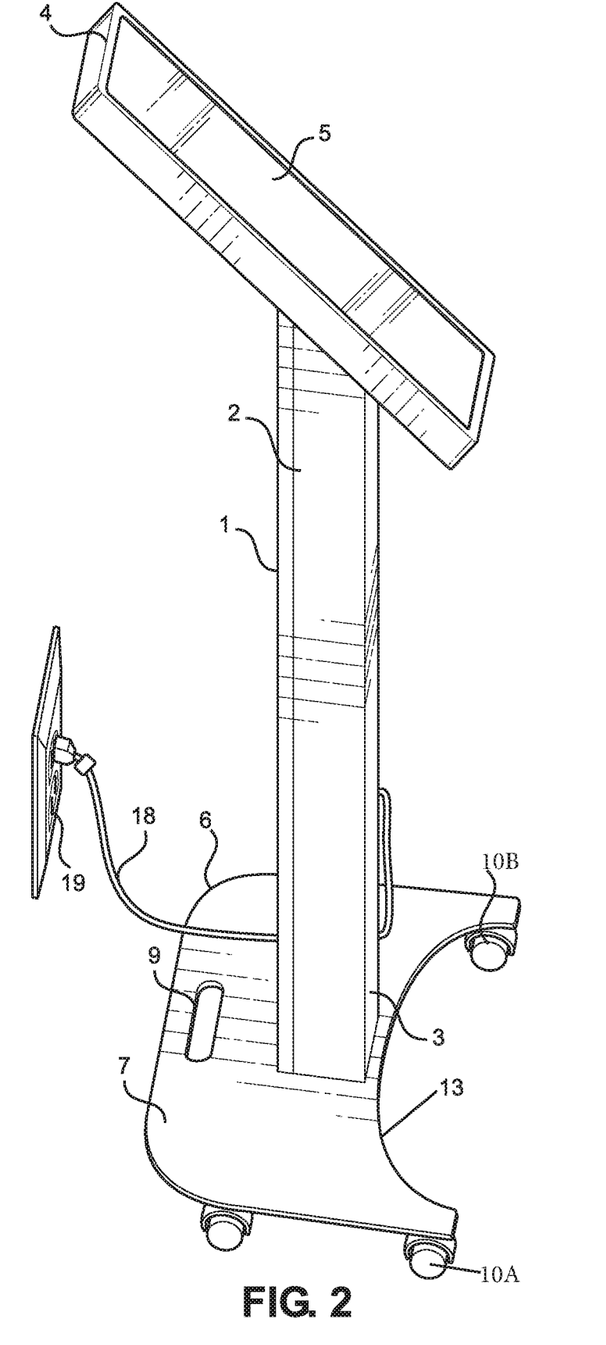
FIG. 2 is a side perspective view of the novel support structure for an electronic device having a touch screen.
Figure 3:
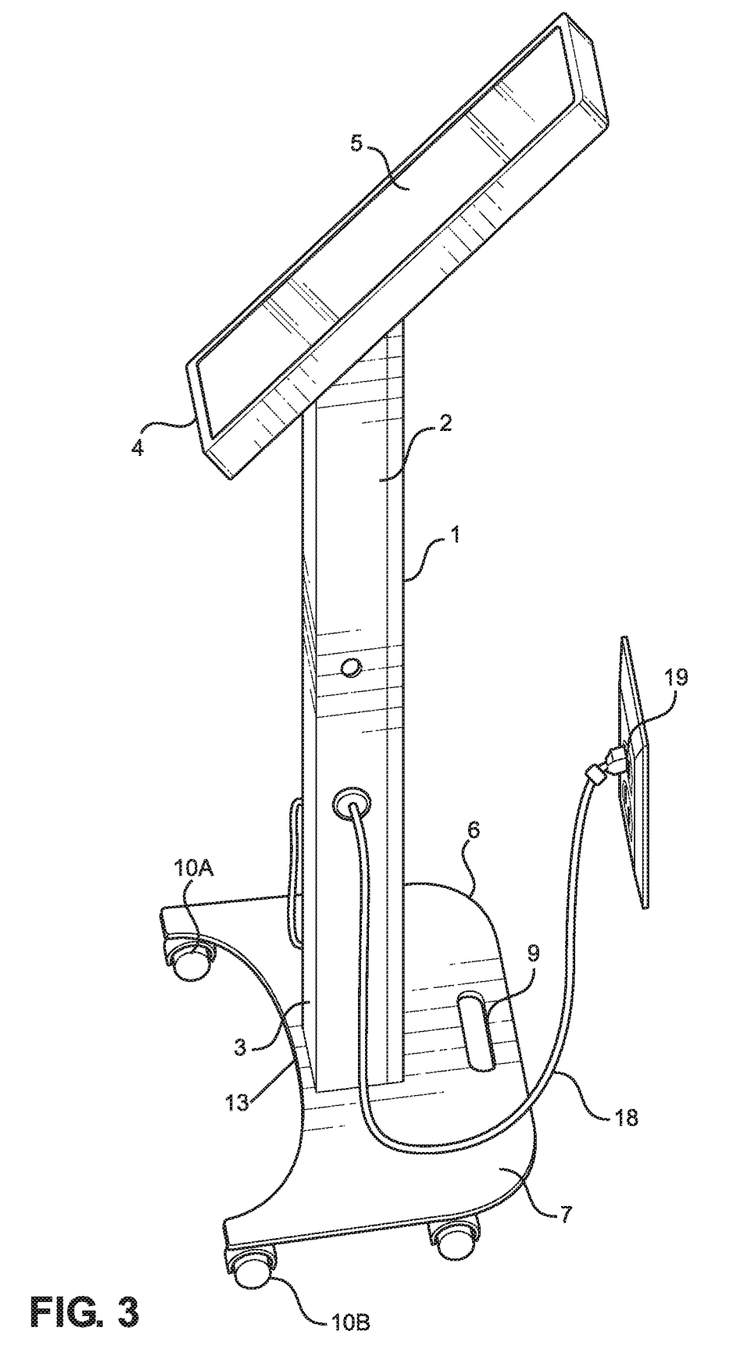
FIG. 3 is a side perspective view of the novel support structure for an electronic device having a touch screen.
Figure 7:
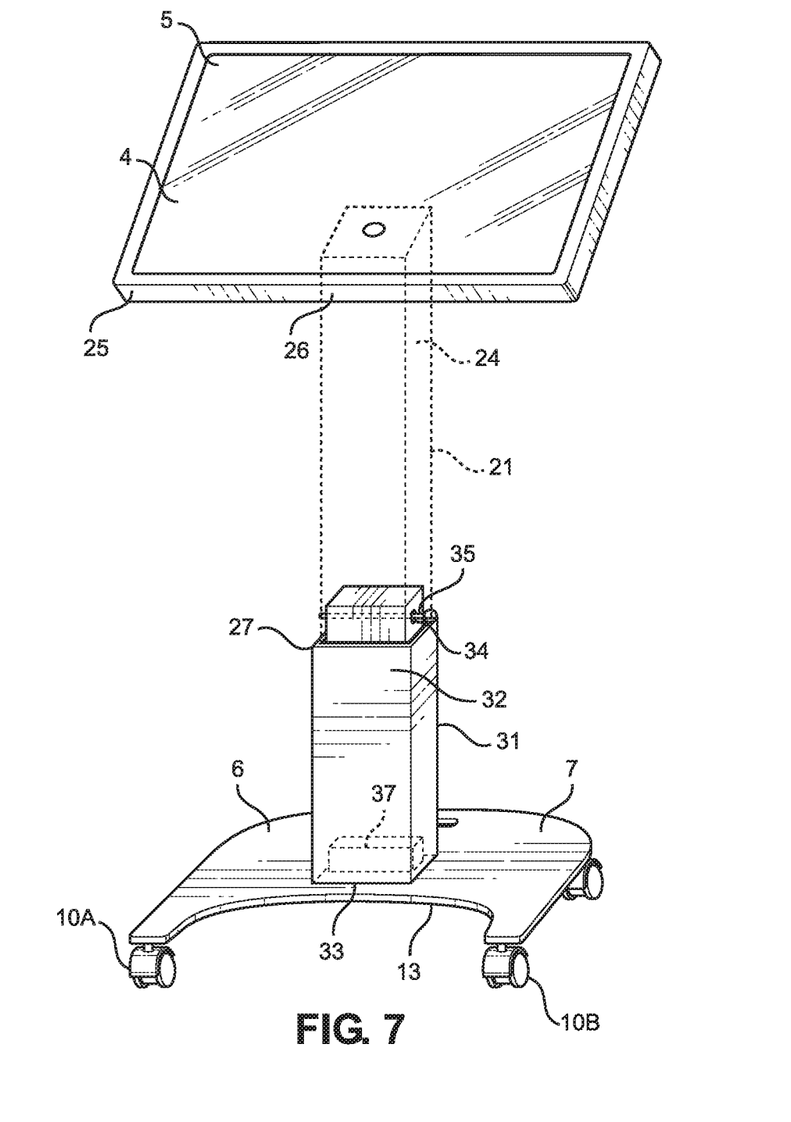
FIG. 7 is a front perspective cut away view of the electronic device connected to a portion of a collapsible support structure in an open configuration.
Figure 8:
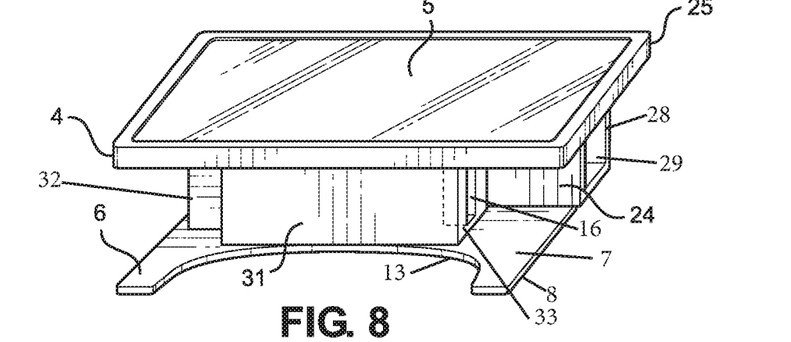
FIG. 8 is a perspective view of novel support structure for an electronic device having a touch screen in a closed orientation with the collapsible support structure stored on the base.

It will now be seen, referring to FIGS. 1-4, novel support structure 1 for electronic device 4 has touch screen 5 (FIGS. 1-3). FIG. 1 best illustrates touch screen 5 having application icons 17A-17F such as different construction related apps configured for a user to activate through the graphic user interface of touch screen 5. It is within the scope of this invention for a programmer to program a predetermined selection of desirable apps that are to be accessible to the users of electronic device 4. FIGS. 1-3 illustrate support structure 1 having first end 2 located opposite second end 3 of support structure 1. Second end 3 of support structure 1 is connected to first side 7 of base 6. Base 6 has radius portion 13 (FIGS. 1-3, 6-10) configured to make room for a user's feet while a user is operating electronic device 4. Base 6 can have opening 9 which serves as a handle portion for a user to grasp with their hand during transport. Base 10 can have a plurality of rollers or casters 10A-10B (FIGS. 1-3, 6-7, 9-10), 10C and 10D (FIG. 10) connected thereto. FIG. 8 illustrates an embodiment in which base 6 does not have casters connected thereto.

FIGS. 2-3 illustrate support stand 1 having electrical cord 18 connected thereto. At least one end of electrical cord 18 is connected to an opening of support stand 1 and connects with circuitry of electronic device 4 to power electronic device 4. The other end of electrical cord is connected to wall outlet 19. It is within the scope of this invention for electronic device 4 to be charged or replenished with any power source including, but not limited to, solar power, a remote power source, or battery power.

Figure 4:
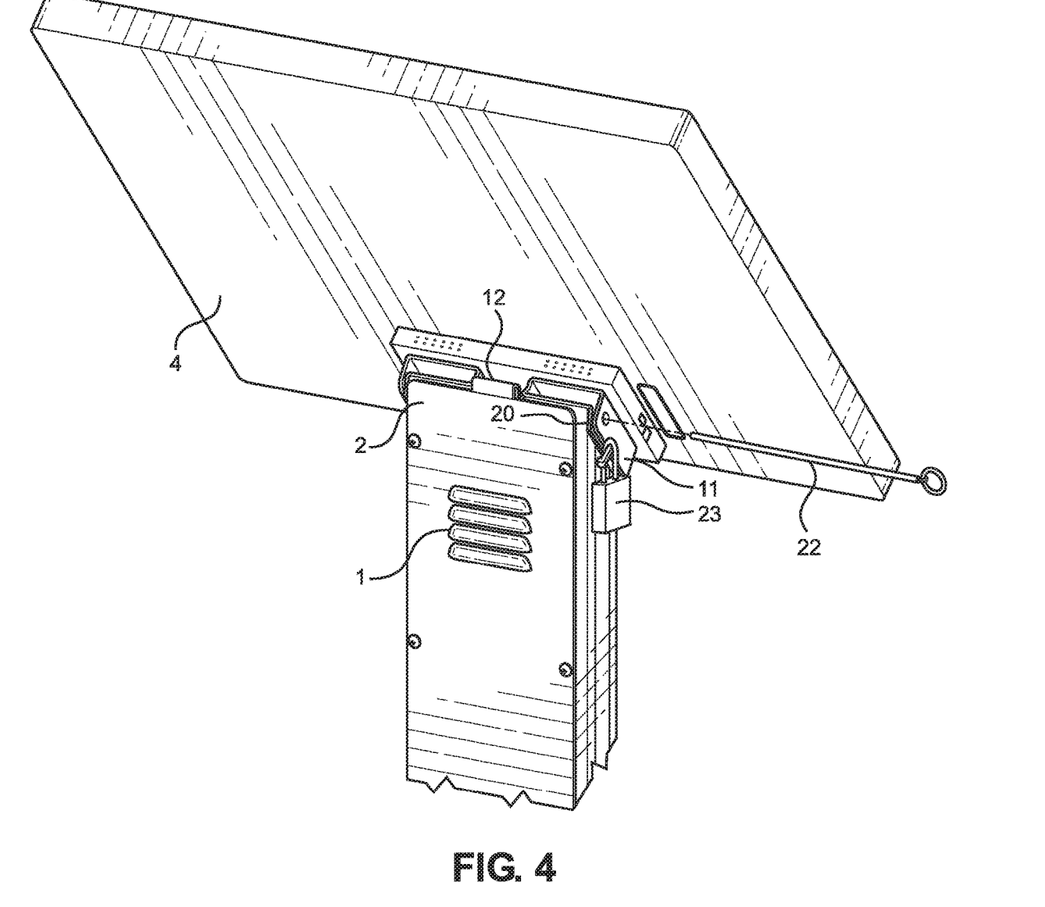
FIG. 4 is a partial rear perspective view of the bracket of the electronic device connected to the capturing structure of the first end of the support structure.
Figure 5:
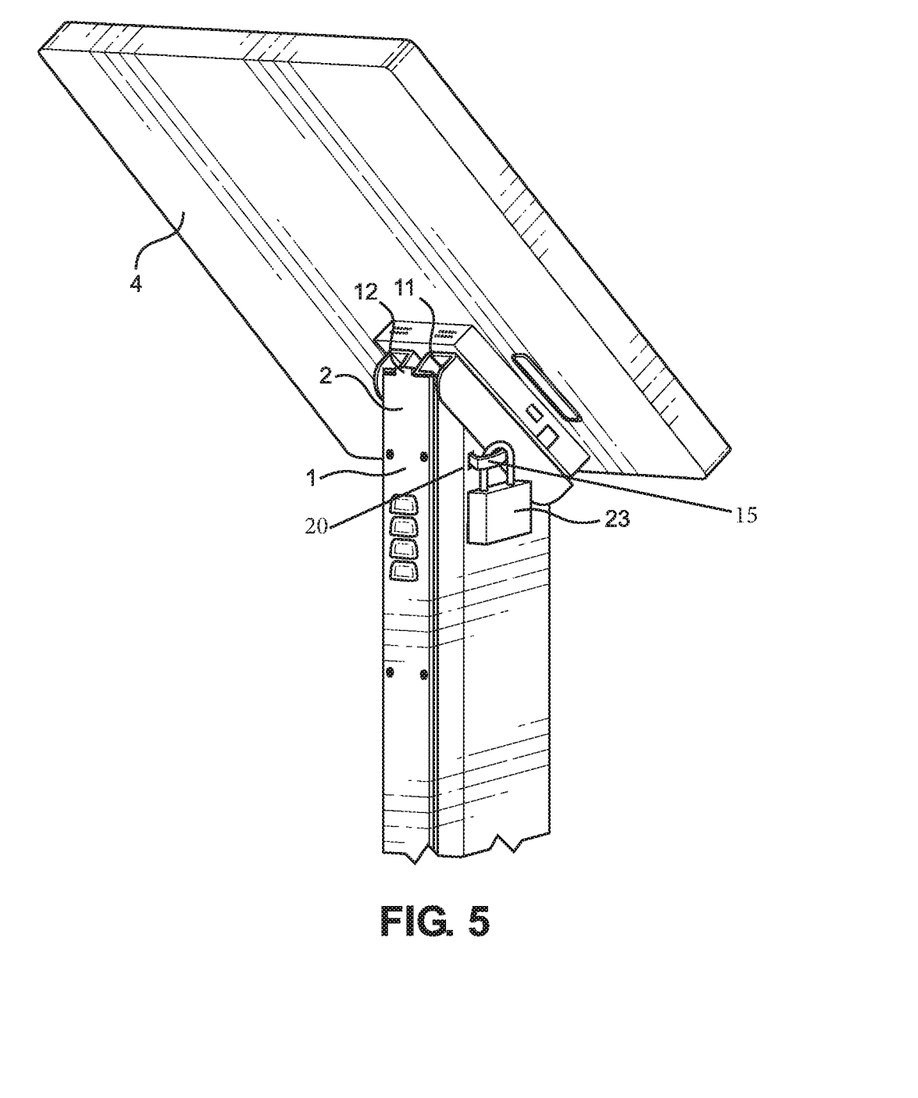
FIG. 5 is a partial rear perspective view of the bracket of the electronic device connected to the capturing structure of the first end of the support structure.
Figure 6:
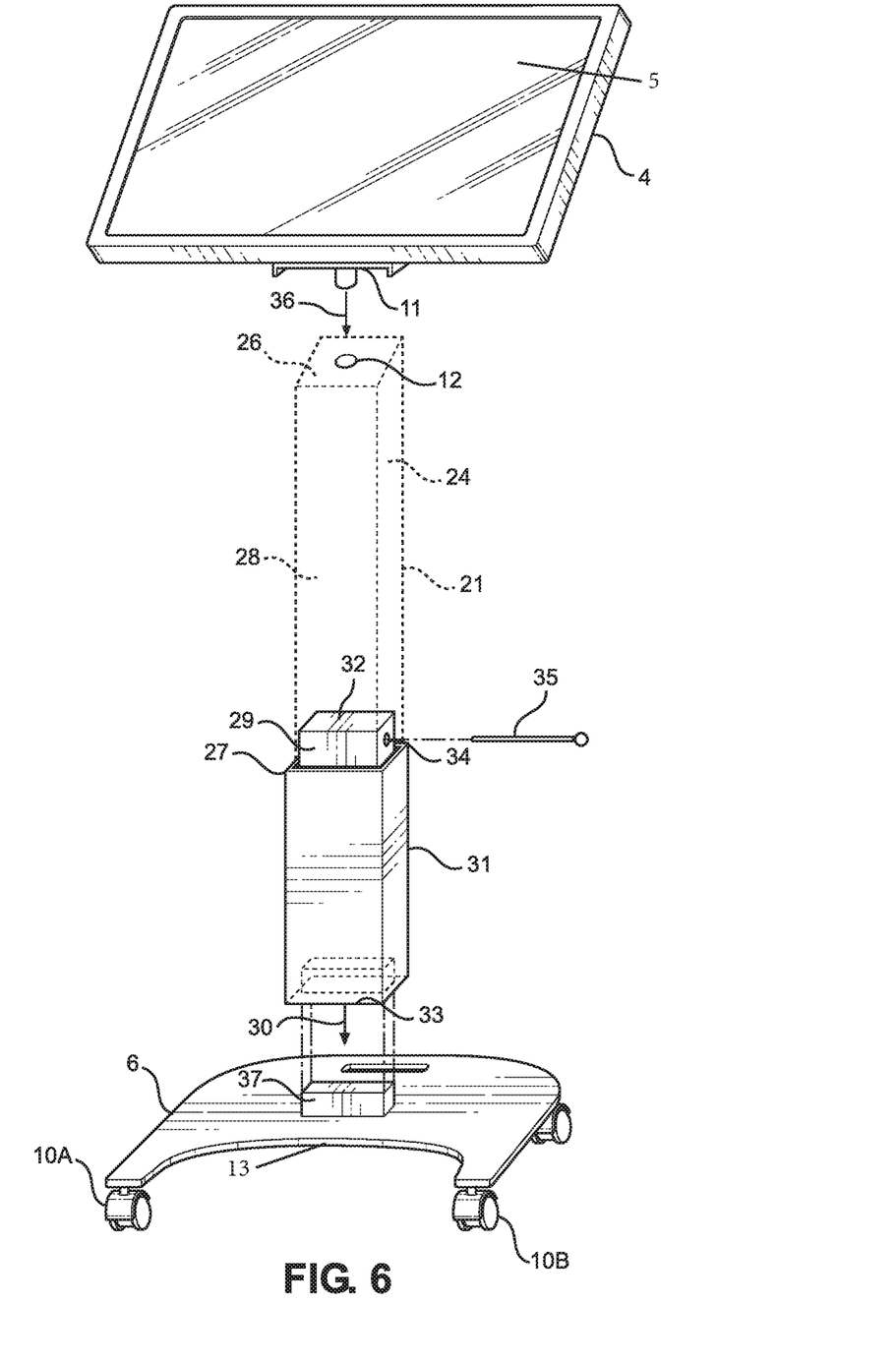
FIG. 6 is an exploded cut away view of the electronic device connected to a portion of a collapsible support structure in an open configuration.

FIGS. 4-5 illustrate first end 2 of electronic device 4 has capturing structure 12. Capturing structure 12 removably connects to bracket 11 of electronic device 4. It is within the scope of this invention for capturing structure to include, but not be limited to, a latch, a hook (FIGS. 4-5), or an opening 12 (FIG. 6). Bracket 11 has a side connected to rear portion of electronic device 4 located opposite another side removably connected to capturing structure 12. Capturing structure 12 is located on first end 2 of support structure 1. Lock mechanism 20 is pad lock 23 connecting bracket 11 of electronic device 4 to support structure 1. FIG. 4 illustrates an embodiment in which locking mechanism 20 can be lock pin 22 positioned through an opening of bracket 11 of electronic device 4 and through opening of either support structure 1 or through an opening of capturing structure 12. FIG. 5 shows locking mechanism 20 having protruding portion 15 receiving at least a portion of padlock 23. It is within the scope of this invention for locking mechanism to include, but not be limited to, any locking mechanism such as mechanical, digital, or fingerprint lock.

FIG. 6 illustrates electronic device 4 having touch screen 5. Bracket 11 (FIG. 6) is connected to electronic device 4. At least a portion of bracket 11 is retained by capturing structure being opening 12. Bracket 11 is removably connected 36 to first end 26 of first portion 24 of telescoping support structure 21. FIGS. 6-7 illustrate telescoping support structure 21 having a first portion 24 and second portion 31. First portion 24 of telescoping support structure 21 has a hollow chamber 28. First portion 24 of telescoping support structure 21 has first end 26 located opposite second end 27. Chamber 28 of first portion 24 of telescoping support structure 21 has chamber opening 29 receiving at least a portion of first end 32 of second portion 31 of telescoping support structure 21. Second portion 31 of telescoping support structure 21 has first end 32 located opposite second end 33 (FIG. 6, 8-10). Second end 33 of telescoping support structure 21 is removably connected 30 to base 6. In particular, as illustrated in FIGS. 6-7, base 6 may have mounting surface being a protruding portion 37 (FIGS. 9-10) configured to be received by an opening 16 (FIGS. 8-9) of second end 33 of second portion 31 of telescoping support structure 21.

Referring now to FIGS. 6-7, telescoping support structure 21 has locking mechanism being locking pin 35 received by opening 34 located on both first portion 24 and second portion 31 of telescoping support structure 21. Locking pin 35 may be completely removable, depressed, or spring actuated to engage a corresponding opening of telescoping support structure 21. Electronic device 4 is retained within a water resistant housing 25 (FIG. 8). Telescoping or collapsible support stand is oriented in an open configuration when in use.

Figure 9:
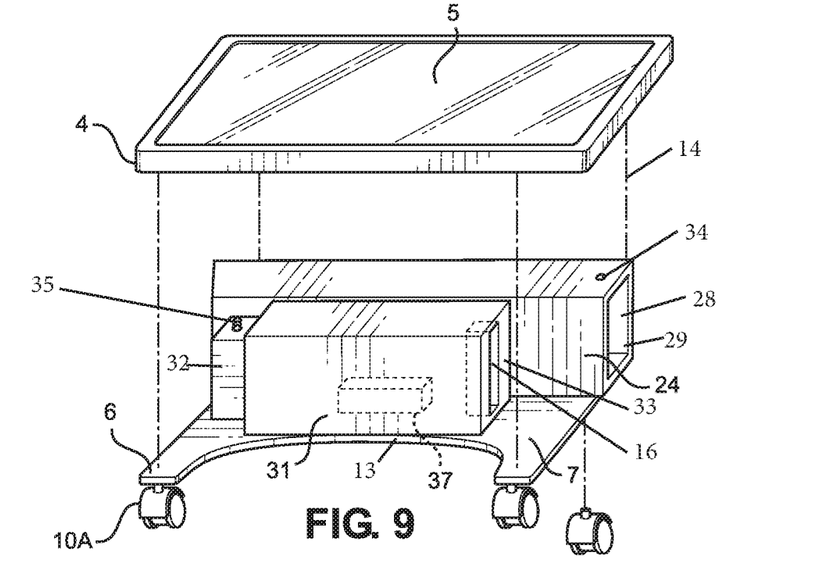
FIG. 9 is an exploded view of novel support structure for an electronic device having a touch screen in a closed orientation with the collapsible support structure stored on the base; and, FIG. 10 is a top view of novel support structure in a closed orientation with the collapsible support structure stored on the base.

FIGS. 8-9 illustrate first portion 24 having chamber opening 29 bordering chamber 28 and second portion 31 of collapsible stand 21 oriented in a closed position during storage and when not in use. Chamber opening 29 of first portion 24 of collapsible support structure receives first end 32 of second portion 31 of collapsible support structure. Second portion 31 of collapsible support structure has first protruding end 32 located opposite recess 16. Recess 16 receives protrusion 37 (FIGS. 9-10) of base plate 6. Electronic device 4 has touch screen 5. During storage first portion 24 of collapsible support structure 21 and second portion 31 of collapsible support structure 21 may connect to first side 7 of base 6. Base has second side 8 (FIG. 8) located opposite side 7 of base 6.

Figure 10:
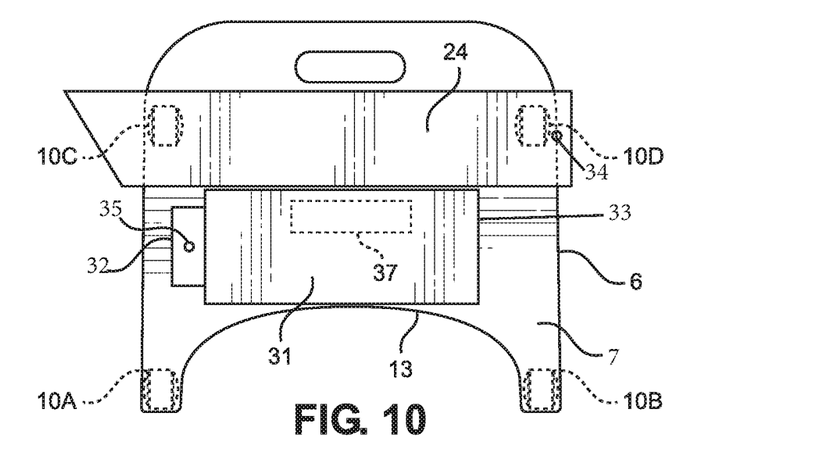

FIGS. 9-10 show first end 32 of second portion 31 of collapsible support structure having a locking pin configure to be depressed and to be received by opening 34 of first portion 24. FIG. 9 illustrates electronic device 4 overlaying 14 the stored support structures 24 and 31 when oriented in a closed orientation during storage.

It will thus be seen that the objects set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

Now the invention has been described.

The invention claimed is:

1. A collapsible support structure for a removable electronic device, comprising:

the electronic device, said electronic device having a touch screen, said electronic device having a bracket connected thereto;

a power source, said electronic device is in electrical communication with said power source;

the collapsible support structure, said collapsible support structure having a first portion and a second portion, said first portion of said collapsible support structure having a first end located opposite a second end, said first end of said first portion of said collapsible support structure having a capturing structure removably connected to said bracket of said electronic device, said second end of said first portion of said collapsible support structure having a chamber opening bordering a chamber;

said second portion of said collapsible support structure having a first end located opposite a second end, said first end of said second portion of said collapsible support structure having a locking pin, said first end of said second portion of said collapsible support structure is received by said chamber opening of said second end of said first portion of said collapsible support structure, said locking pin is received by a locking mechanism opening of said first portion of said collapsible support structure, said second end of said second portion of said collapsible support structure having an opening;

a base, said base having a first side located opposite a second side, said first side of said base having a protrusion, said protrusion is received by said opening of said second end of said second portion of said collapsible support structure;

said first portion and said second portion of said collapsible support structure are positioned parallel to each other when in an unassembled or closed orientation, said first portion and said second portion of said collapsible support structure and are both in contact with said base when in said closed orientation, said electronic device overlays said first portion and said second portion of said collapsible support structure when oriented in said closed configuration.

2. The support structure of claim 1, further comprising: said second side of said base is connected to a plurality of casters.

3. The support structure of claim 1, further comprising:
said electronic device having at least one predetermined application, said application is configured to be accessible to a user through a graphic user interface of said touch screen of said electronic device.

4. The support structure of claim 1, further comprising:
said base having a curved portion.

* * * * *